(12) United States Patent
Edamura et al.

(10) Patent No.: US 12,327,976 B2
(45) Date of Patent: Jun. 10, 2025

(54) EXTERNAL RESONANCE-TYPE LASER MODULE

(71) Applicant: HAMAMATSU PHOTONICS K.K., Hamamatsu (JP)

(72) Inventors: Tadataka Edamura, Hamamatsu (JP); Atsushi Sugiyama, Hamamatsu (JP); Naota Akikusa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 678 days.

(21) Appl. No.: 17/675,166

(22) Filed: Feb. 18, 2022

(65) Prior Publication Data

US 2022/0271491 A1 Aug. 25, 2022

(30) Foreign Application Priority Data

Feb. 24, 2021 (JP) ................................ 2021-027525

(51) Int. Cl.

| | |
|---|---|
| *H01S 3/08* | (2023.01) |
| *H01S 3/1055* | (2006.01) |
| *H01S 5/02253* | (2021.01) |
| *H01S 5/14* | (2006.01) |
| *H01S 5/34* | (2006.01) |

(52) U.S. Cl.
CPC ........ *H01S 3/08059* (2013.01); *H01S 3/1055* (2013.01); *H01S 5/02253* (2021.01); *H01S 5/141* (2013.01); *H01S 5/3401* (2013.01); *H01S 5/3402* (2013.01)

(58) Field of Classification Search
CPC .............. H01S 3/08059; H01S 3/1055; H01S 5/02253; H01S 5/141; H01S 5/3401; H01S 5/3402; H01S 5/02325
See application file for complete search history.

(56) References Cited

U.S. PATENT DOCUMENTS

| | | | |
|---|---|---|---|
| 2009/0225802 A1 | 9/2009 | Day et al. | |
| 2018/0062350 A1* | 3/2018 | Sugiyama | ............. H01S 3/1055 |
| 2019/0052058 A1* | 2/2019 | Edamura | ............... H01S 5/0622 |

FOREIGN PATENT DOCUMENTS

| | | |
|---|---|---|
| JP | 2008-076569 A | 4/2008 |
| JP | 2019-036577 A | 3/2019 |

OTHER PUBLICATIONS

A machine translation of JP2008-076569A (Year: 2008).*

* cited by examiner

*Primary Examiner* — Yuanda Zhang
(74) *Attorney, Agent, or Firm* — Faegre Drinker Biddle & Reath LLP

(57) ABSTRACT

An external resonance-type laser module includes: a quantum cascade laser; a MEMS diffraction grating including a movable portion capable of swinging around an axis and a diffraction grating portion formed on the movable portion; a lens; a magnet; and a yoke. The MEMS diffraction grating includes a pair of coils respectively disposed on one side and the other side with respect to the axis when viewed in a normal direction parallel to a normal line of the diffraction grating portion, and each of the pair of coils includes an inside part extending along the axis. A recess portion is formed in the magnet, and at least a part of the recess portion overlaps the inside part when viewed in the normal direction.

8 Claims, 12 Drawing Sheets

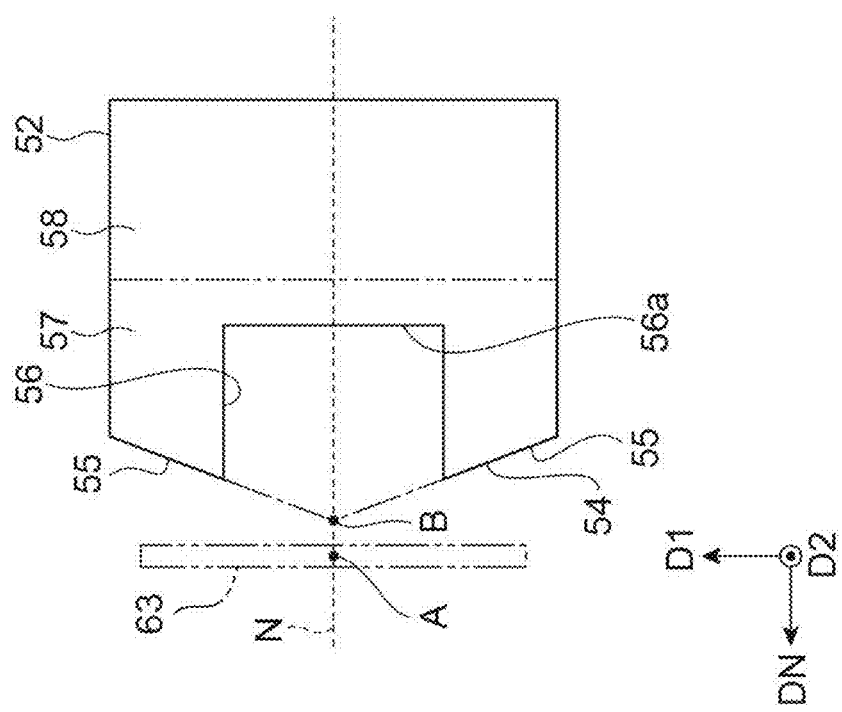
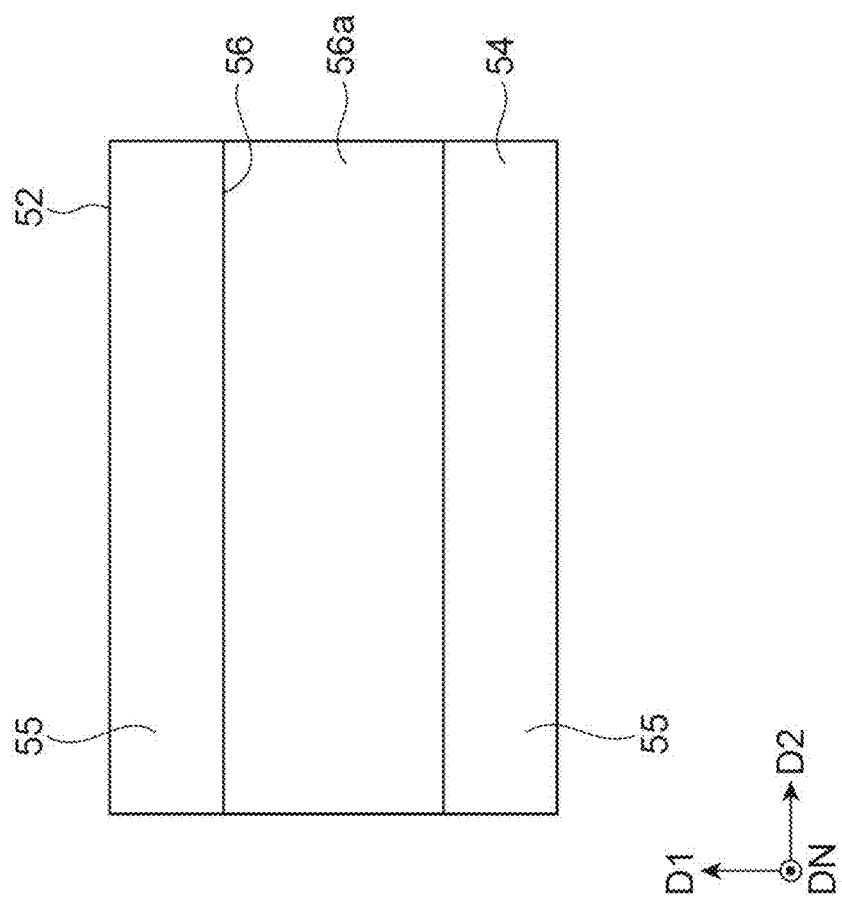

EXTERNAL RESONANCE-TYPE LASER MODULE

TECHNICAL FIELD

One aspect of the present disclosure relates to an external resonance-type laser module provided with a micro electro mechanical systems (MEMS) diffraction grating.

BACKGROUND

An external resonance-type laser module including a quantum cascade laser, a swingable diffraction grating, and a lens disposed between the quantum cascade laser and the diffraction grating is known (see, for example, U.S. Unexamined Patent Publication No. 2009/0225802). In such an external resonance-type laser module, light from the quantum cascade laser is diffracted and reflected by the diffraction grating and light having a specific wavelength in the light is returned to the quantum cascade laser. As a result, an external resonator is configured by an end surface of the quantum cascade laser and the diffraction grating and light having a specific wavelength is amplified and output to the outside. The wavelength of the output light is changed by swinging the diffraction grating, and then wavelength sweeping can be performed in a predetermined wavelength range.

In the external resonance-type laser module as described above, it is required to increase the deflection angle of the diffraction grating by an increase in driving force so that the range of the wavelength sweeping is expanded. In particular, when the quantum cascade laser is used, the beam diameter of the light emitted from the quantum cascade laser is large, and thus it is necessary to increase the area of the diffraction grating and a large driving force is required. In addition, it is required to stably operate the diffraction grating for a satisfactory wavelength sweeping and the external resonance-type laser module is required to be reduced in size.

SUMMARY

In this regard, an object of one aspect of the present disclosure is to provide an external resonance-type laser module that enables size reduction and makes it possible to stably operate a MEMS diffraction grating while ensuring a large deflection angle.

An external resonance-type laser module according to one aspect of the present disclosure includes: a quantum cascade laser; a MEMS diffraction grating including a movable portion capable of swinging around a predetermined axis and a diffraction grating portion formed on the movable portion, in which the MEMS diffraction grating diffracts and reflects light emitted from the quantum cascade laser by the diffraction grating portion, and returns a part of the light to the quantum cascade laser; a lens disposed between the quantum cascade laser and the MEMS diffraction grating; a magnet disposed on a side opposite to the quantum cascade laser with respect to the MEMS diffraction grating; and a yoke forming a magnetic circuit together with the magnet, in which the MEMS diffraction grating further includes a coil on which a magnetic force of the magnet acts, the coil includes a pair of coils respectively disposed on one side and the other side with respect to the axis when viewed in a normal direction parallel to a normal line of the diffraction grating portion, and each of the pair of coils includes an inside part extending along the axis, and a recess portion is formed in a surface of the magnet on a side of the MEMS diffraction grating and at least a part of the recess portion overlaps the inside part of each of the pair of coils when viewed in the normal direction.

In this external resonance-type laser module, the magnet is disposed on the side opposite to the quantum cascade laser with respect to the MEMS diffraction grating. As a result, the size of the module can be reduced as compared with a case where, for example, the magnet is disposed on the lateral side of the MEMS diffraction grating. In addition, the coil of the MEMS diffraction grating is provided with the pair of coils, which are respectively disposed on one side and the other side with respect to the axis when viewed in the normal direction. In this case, each of the pair of coils has the inside part extending along the axis and an outside part extending on the outer edge side of the movable portion. With such a configuration, currents are capable of flowing through the outside parts of the coils in the same direction and a large driving force (furthermore, deflection angle) can be ensured. Meanwhile, the direction of current flow through the inside parts is opposite to the direction of current flow through the outside parts, and thus a vibration mode other than vibration around the axis may occur in the movable portion and the operation of the MEMS diffraction grating may become unstable. In this regard, in this external resonance-type laser module, the recess portion is formed in the surface of the magnet on the side of the MEMS diffraction grating and at least a part of the recess portion overlaps the inside parts of the pair of coils when viewed in the normal direction. As a result, the magnetic force acting on the inside parts of the coils can be reduced and the operation can be stabilized. In addition, the recess portion is formed at the part of the magnet overlapping the inside parts of the coils, and thus the total volume of the magnet can be ensured, a magnetic force acting on the outside parts of the coils can be ensured, and a large driving force can be ensured. Accordingly, with this external resonance-type laser module, size reduction can be achieved and it is possible to stably operate the MEMS diffraction grating while ensuring a large deflection angle.

The recess portion may be a groove extending along a direction parallel to the axis. In this case, it is possible to ensure a magnetic force acting on the outside parts of the coils while reducing the magnetic force acting on the inside parts of the coils.

The recess portion may be a hole having a bottom surface. In this case, it is possible to ensure a magnetic force acting on the outside parts of the coils while reducing the magnetic force acting on the inside parts of the coils.

The surface of the magnet may include a pair of inclined surfaces inclined such that a distance from the movable portion increases as a distance from the axis increases when viewed in a direction parallel to the axis. In this case, it is possible to dispose the magnet closer to the MEMS diffraction grating while suppressing contact of the swinging movable portion with the magnet and a large magnetic force acting on the coils can be ensured.

The magnet may consist of a single member having different magnetic poles on one side and the other side in the normal direction. In this case, only one magnetic pole faces the MEMS diffraction grating, a magnetic circuit can be formed such that a line of magnetic force penetrates the MEMS diffraction grating along the normal direction, and a suitable rotational torque for swinging the movable portion around the axis can be generated.

A width of the recess portion may exceed a width of the inside part of the pair of coils when viewed in the normal direction. In this case, it is possible to ensure a magnetic force acting on the outside parts of the coils while reducing the magnetic force acting on the inside parts of the coils.

Each of the pair of coils may have an outside part extending in parallel to the inside part along an outer edge of the movable portion, and the recess portion may not overlap the outside part of each of the pair of coils when viewed in the normal direction. In this case, it is possible to ensure a magnetic force acting on the outside parts of the coils while reducing the magnetic force acting on the inside parts of the coils.

An actuator device includes a MEMS actuator including a movable portion capable of swinging around a predetermined axis and an optical surface formed on the movable portion, a magnet disposed on a side opposite to the MEMS actuator with respect to the movable portion, and a yoke forming a magnetic circuit together with the magnet. The MEMS actuator further includes a coil on which the magnetic force of the magnet acts, the coil includes a pair of coils respectively disposed on one side and the other side with respect to the axis when viewed in the normal direction parallel to the normal line of the optical surface, and each of the pair of coils includes an inside part extending along the axis. A recess portion is formed in a surface of the magnet on the side of the MEMS actuator, and at least a part of the recess portion overlaps the inside part of each of the pair of coils when viewed in the normal direction. For the reasons described above, this actuator device enables size reduction and makes it possible to stably operate the MEMS diffraction grating while ensuring a large deflection angle.

According to one aspect of the present disclosure, an external resonance-type laser module that enables size reduction and makes it possible to stably operate a MEMS diffraction grating while ensuring a large deflection angle can be provided.

BRIEF DESCRIPTION OF THE DRAWINGS

FIG. 8A is a plan view of the magnet, and FIG. 8B is a side view of the magnet.

DETAILED DESCRIPTION

Figure 1:
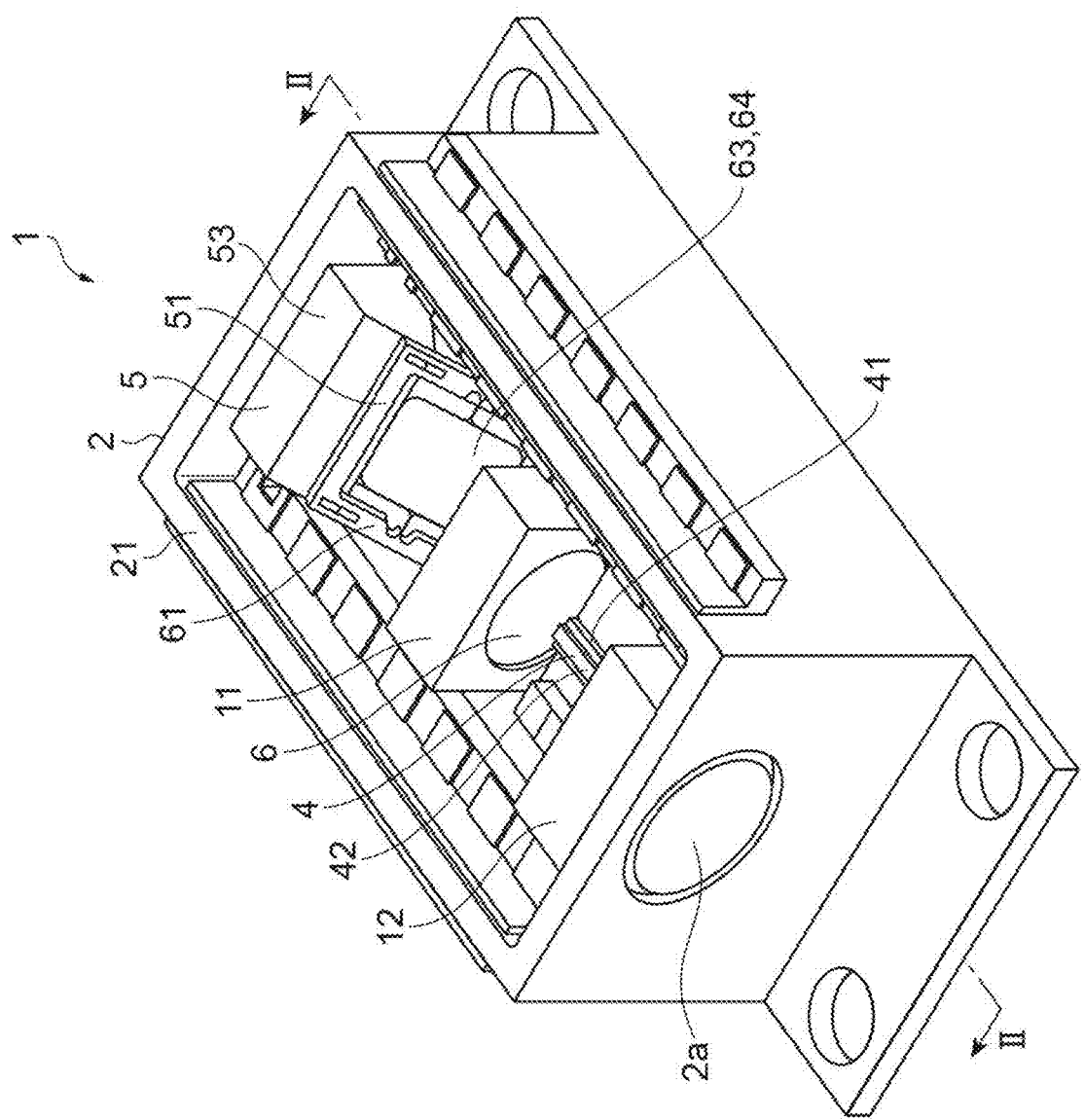
FIG. 1 is a perspective view of a laser module according to an embodiment.

Hereinafter, one embodiment of the present disclosure will be described in detail with reference to the drawings. In the following description, the same reference numerals are used for the same or equivalent elements with redundant description omitted. The X, Y, and Z directions in the drawings are set for convenience.

Figure 2:
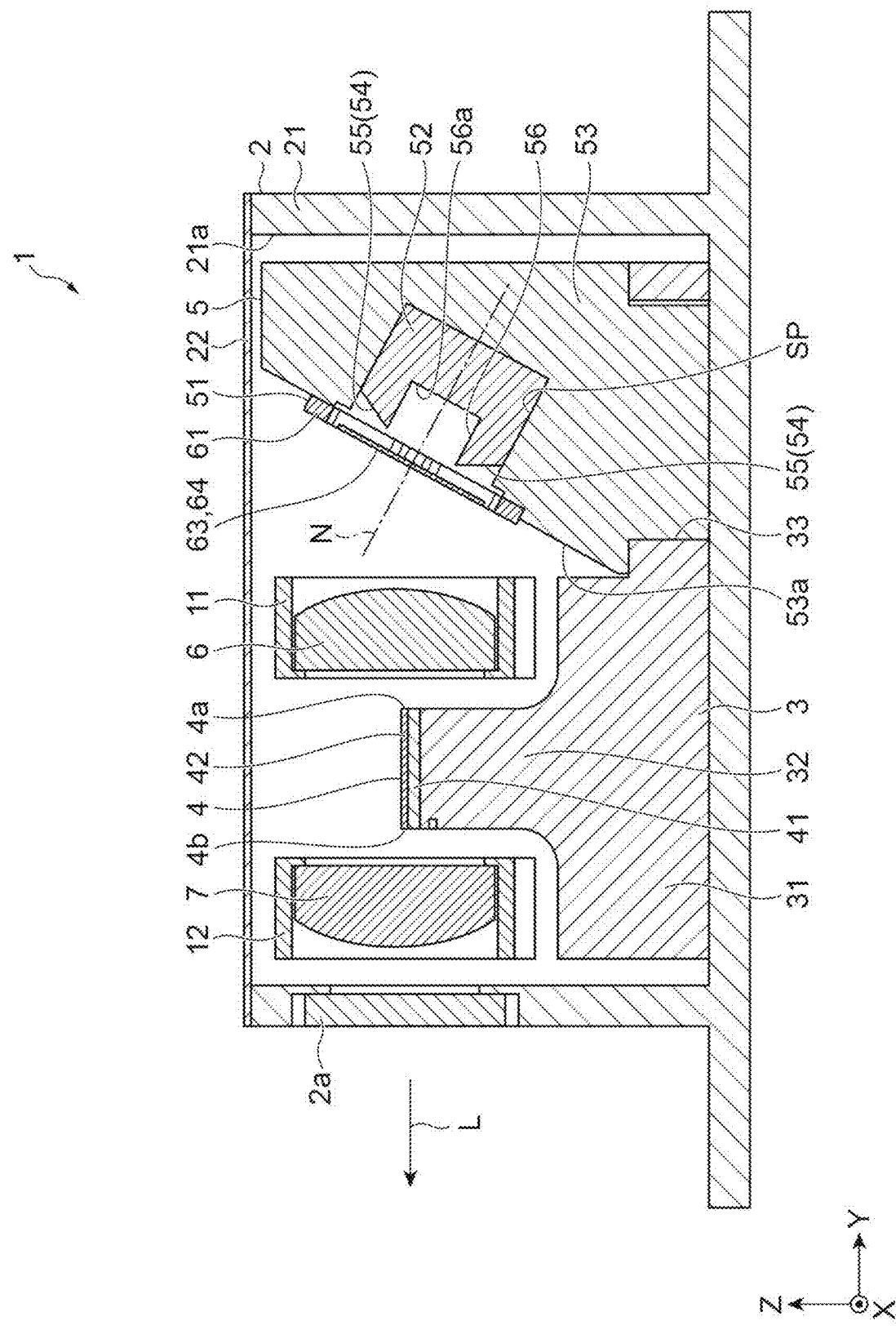
FIG. 2 is a cross-sectional view taken along line II-II of FIG. 1.

As illustrated in FIGS. 1 and 2, an external resonance-type laser module 1 (hereinafter, referred to as "laser module 1") includes a housing 2, a mount member 3, a quantum cascade laser 4 (hereinafter, referred to as "QCL 4"), a diffraction grating unit 5, and lenses 6 and 7. The mount member 3, the QCL 4, the diffraction grating unit 5, and the lenses 6 and 7 are accommodated in the housing 2. The housing 2 constitutes, for example, a butterfly package. As an example, the length of each side of the housing 2 is 30 mm or less. The housing 2 has a main body portion 21 having an opening 21a and a lid portion 22 blocking the opening 21a and is formed in a box shape. The housing 2 has an emission window 2a for outputting output light L of the laser module 1 to the outside.

The mount member 3 is fixed to the bottom surface of the housing 2. The QCL 4, the diffraction grating unit 5, and the lenses 6 and 7 are fixed to the mount member 3. More specifically, the mount member 3 has a main body portion 31 and a protruding portion 32 protruding in the Z direction from the main body portion 31. The QCL 4 is fixed to the top surface of the protruding portion 32. A disposition hole 33 is formed in the main body portion 31. The diffraction grating unit 5 is fixed to the main body portion 31 in a state where a part of a yoke 53, which will be described later, is disposed in the disposition hole 33. The lenses 6 and 7 are held by lens holders 11 and 12, respectively. The lens 6 is fixed to the main body portion 31 via the lens holder 11 and is disposed between the QCL 4 and a MEMS diffraction grating 51 of the diffraction grating unit 5. The lens 7 is fixed to the main body portion 31 via the lens holder 12 and is disposed between the QCL 4 and the emission window 2a. The emission window 2a, the lens 7, the QCL 4, the lens 6, and the MEMS diffraction grating 51 are arranged in this order in the Y direction.

The QCL 4 has a first end surface 4a and a second end surface 4b on the side opposite to the first end surface 4a and emits light in a mid-infrared region (for example, 4 μm to 12 μm) from each of the first end surface 4a and the second end surface 4b. The first end surface 4a and the second end surface 4b are, for example, flat surfaces perpendicular to the Y direction. The first end surface 4a is antireflection-coated.

The QCL 4 has a semiconductor substrate 41 and a laminated structure 42 formed on the semiconductor substrate 41. The laminated structure 42 includes an active layer and a pair of clad layers sandwiching the active layer. The active layer includes, for example, a plurality of quantum well layers made of InGaAs and a plurality of quantum barrier layers made of InAlAs. The clad layer is made of, for example, InP. The active layer and the clad layer are formed on the semiconductor substrate 41 by crystal growth. During the crystal growth, the active layer and the clad layer are formed on the semiconductor substrate 41 along the Z direction (lamination direction, growth direction). The growth direction is the thickness direction of the active layer. The light emitted from the QCL 4 is linearly polarized light parallel to the lamination direction. The laminated structure 42 may include a pair of clad layers and a plurality of active layers having different center wavelengths.

The lenses 6 and 7 are, for example, aspherical lenses made of zinc selenide (ZnSe). The surfaces of the lenses 6 and 7 are antireflection-coated. The lens 6 is disposed on the side of the first end surface 4a with respect to the QCL 4 and collimates the light emitted from the first end surface 4a. The lens 7 is disposed on the side of the second end surface 4b with respect to the QCL 4 and collimates the light emitted from the second end surface 4b. The light collimated by the lens 7 passes through the emission window 2a of the housing 2 and is output to the outside as the output light L.

The light collimated by the lens 6 is incident on the MEMS diffraction grating 51 of the diffraction grating unit 5. By diffracting and reflecting this incident light, the MEMS diffraction grating 51 returns the light that has a specific wavelength in the incident light to the first end surface 4a of the QCL 4. In the laser module 1, the MEMS diffraction grating 51 and the second end surface 4b constitute a Littrow-type external resonator. As a result, the laser module 1 is capable of amplifying light having a specific wavelength and outputting the light to the outside.

In addition, in the MEMS diffraction grating 51, the direction of a diffraction grating portion 64 diffracting and reflecting incident light can be changed at a high speed as will be described later. As a result, the wavelength of the light returning from the MEMS diffraction grating 51 to the first end surface 4a of the QCL 4 is variable and, and furthermore, the wavelength of the output light L of the laser module 1 is variable. By changing the wavelength of the output light L, wavelength sweeping can be performed within, for example, the range of the gain band of the QCL 4.

The diffraction grating unit 5 includes the MEMS diffraction grating 51, a magnet 52, and the yoke 53. The MEMS diffraction grating 51 is formed in a substantially plate shape. The magnet 52 is disposed on the side opposite to the QCL 4 with respect to the MEMS diffraction grating 51. The MEMS diffraction grating 51 is fixed to the yoke 53, and the magnet 52 is accommodated in the yoke 53. As a result, the MEMS diffraction grating 51, the magnet 52, and the yoke 53 are integrated and constitute one unit.

As illustrated in FIGS. 3 to 6, the MEMS diffraction grating 51 includes a support portion 61, a pair of connecting portions 62, a movable portion 63, the diffraction grating portion 64, and a pair of coils 65 and 66. The MEMS diffraction grating 51 is configured as a MEMS device swinging the movable portion 63 around an axis A. The MEMS diffraction grating 51 is formed by processing a semiconductor substrate using a MEMS technique (such as patterning and etching).

The support portion 61 is a flat plate-shaped frame body having a rectangular shape in a plan view (when viewed in a normal direction DN to be described later). The support portion 61 supports the movable portion 63 via the pair of connecting portions 62. Each of the connecting portions 62 is a flat plate-shaped member having a rectangular rod shape in a plan view and extends straight along the axis A. Each of the connecting portions 62 connects the movable portion 63 to the support portion 61 on the axis A such that the movable portion 63 is capable of swinging around the axis A.

The movable portion 63 is positioned inside the support portion 61. As described above, the movable portion 63 is capable of swinging around the axis A. The movable portion 63 is a flat plate-shaped member having a substantially rectangular shape in a plan view and has four corner portions 63a. The movable portion 63 is chamfered in an R shape in each of the corner portions 63a, and each of the corner portions 63a is formed in a round shape. For example, each of the corner portions 63a is curved in a circular arc shape in a plan view. As a result, the moment of inertia of the movable portion 63 can be reduced and the swing of the movable portion 63 can be increased in speed. In this example, the movable portion 63 is formed in a substantially rectangular shape in which the long side is parallel to a first direction D1 and the length of the movable portion 63 in the first direction D1 exceeds the length of the movable portion 63 in a second direction D2. As an example, the length of the movable portion 63 in the first direction D1 is approximately 4 mm, the length of the movable portion 63 in the second direction D2 is approximately 3 mm, and the thickness of the movable portion 63 is approximately 30 µm. The support portion 61, the connecting portion 62, and the movable portion 63 are integrally formed by, for example, being built into one silicon-on-insulator (SOI) substrate.

The diffraction grating portion 64 is provided on the surface of the movable portion 63 on the side of the QCL 4. The diffraction grating portion 64 has a plurality of lattice grooves 64a and diffracts and reflects the light emitted from the QCL 4. The diffraction grating portion 64 includes, for example, a resin layer provided on the surface of the movable portion 63 and having a diffraction grating pattern and a metal layer provided over the surface of the resin layer so as to follow the diffraction grating pattern. Alternatively, the diffraction grating portion 64 may be configured only by a metal layer provided on the movable portion 63 and having a diffraction grating pattern. Although the diffraction grating pattern in this example is a blazed grating with a serrated cross section for an increase in diffraction efficiency, the pattern may be a binary grating with a rectangular cross section, a holographic grating with a sinusoidal cross section, or the like. The diffraction grating pattern is formed on the resin layer by, for example, a nanoimprint lithography method. The metal layer is, for example, a metal reflective film made of gold and is formed by evaporation.

Figure 5:
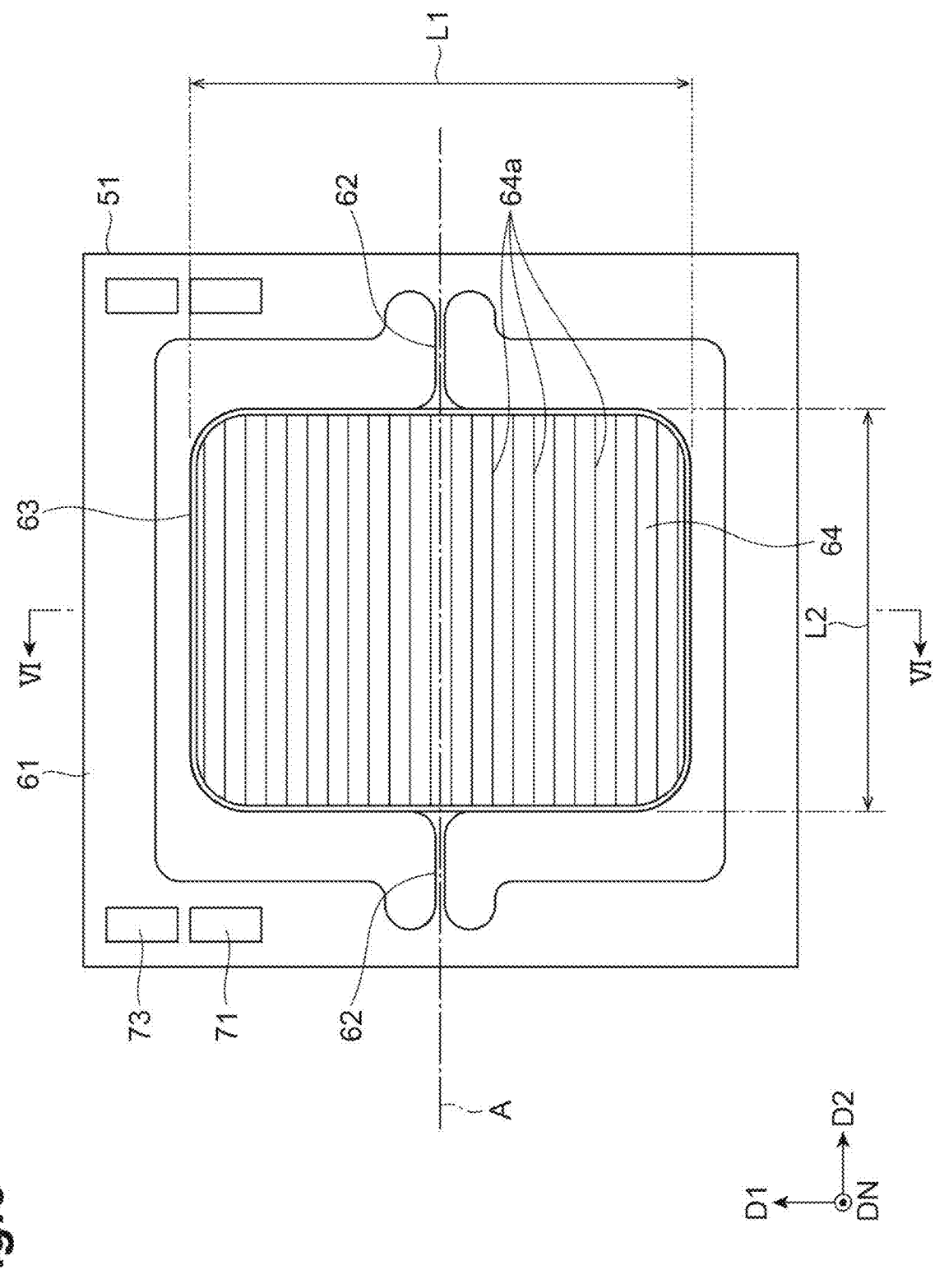
FIG. 5 is a view of the MEMS diffraction grating viewed in the normal direction.
Figure 6:
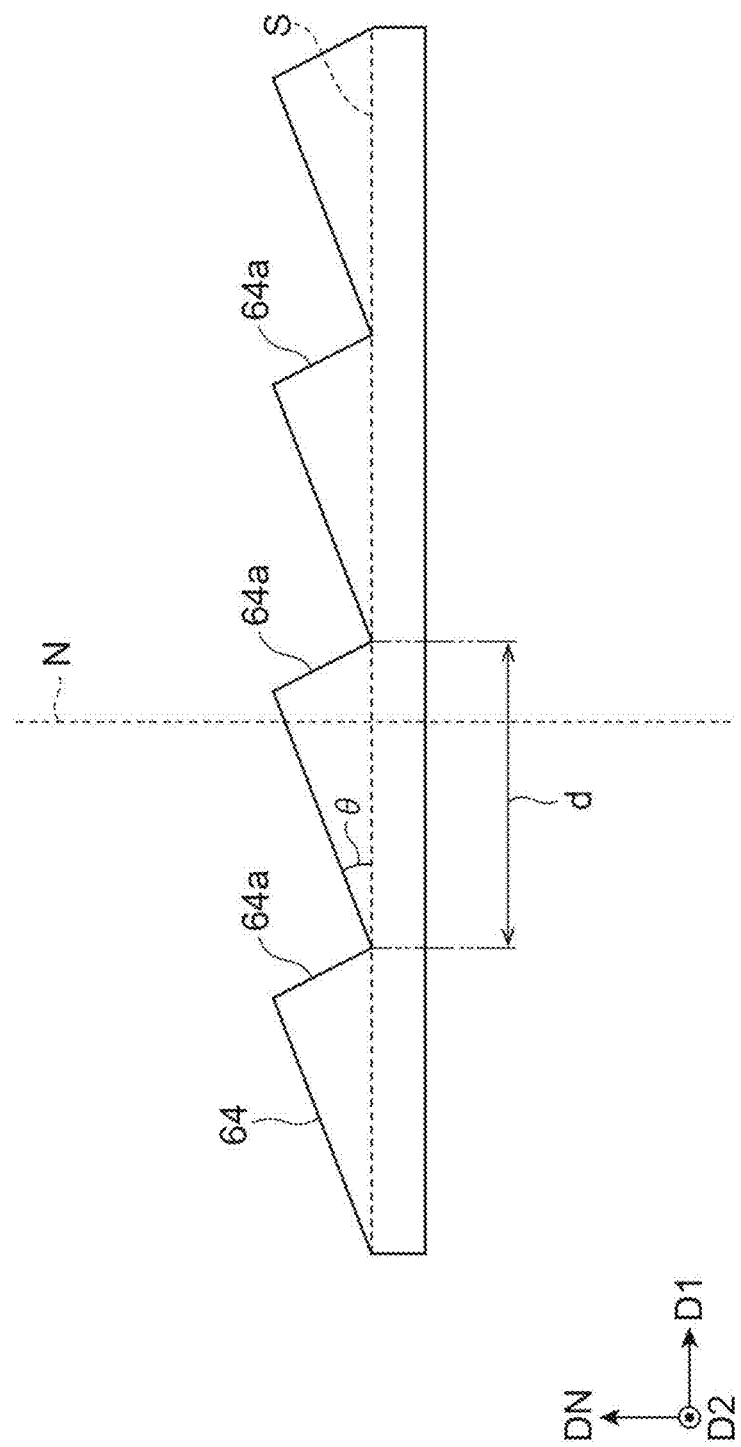
FIG. 6 is a cross-sectional view of a diffraction grating portion taken along line VI-VI of FIG. 5.
Figure 7:
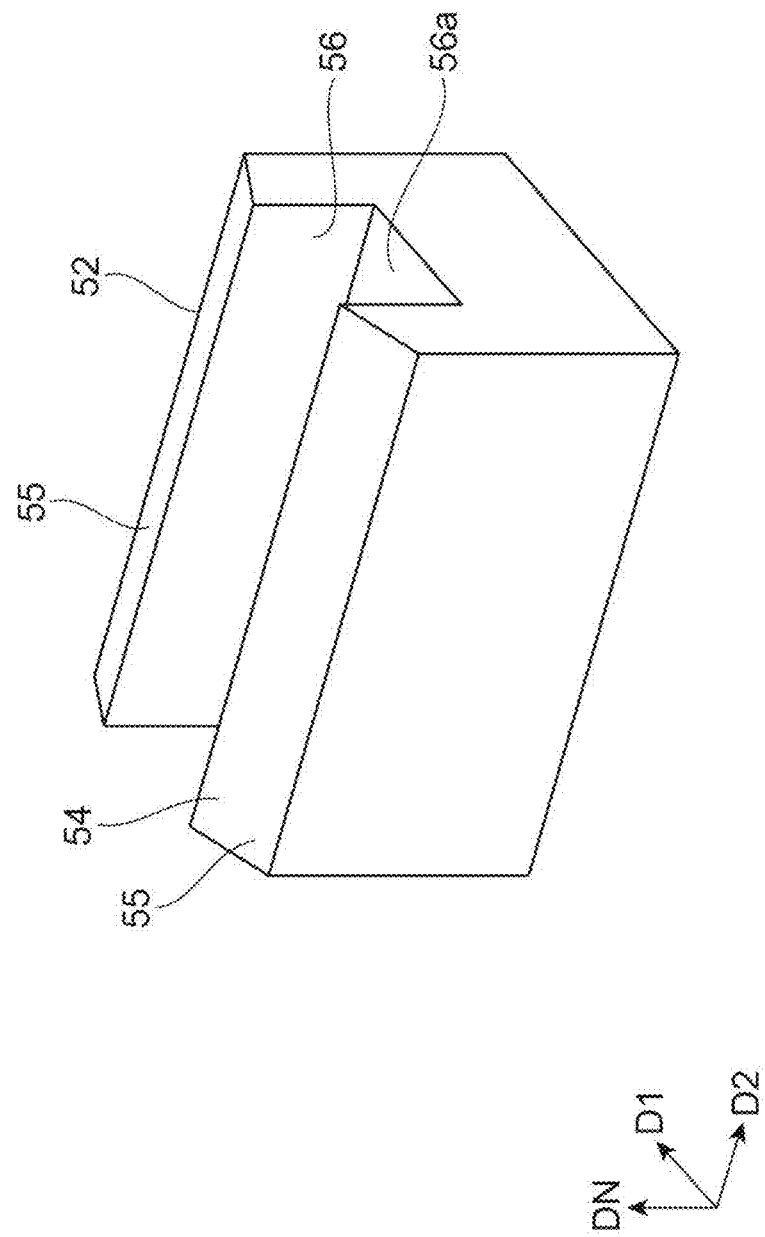
FIG. 7 is a perspective view of a magnet.

As illustrated in FIG. 5, the plurality of lattice grooves 64a are arranged at equal intervals in the first direction D1. Each of the lattice grooves 64a extends straight in the second direction D2 perpendicular to the first direction D1. The second direction D2 is parallel to the axis A. A repeat cycle (distance between the adjacent lattice grooves 64a) d of the lattice grooves 64a in the first direction D1 is, for example, 4 µm to 10 µm. An angle (blazed angle) θ of the lattice groove 64a with respect to the normal direction DN parallel to a normal line (straight line perpendicular to a lattice surface S) N of the diffraction grating portion 64 is, for example, 20 degrees to 35 degrees.

The diffraction grating portion 64 is formed to be one size smaller than the movable portion 63 in a plan view, and the outer edge of the diffraction grating portion 64 extends along the outer edge of the movable portion 63 at a certain interval from the outer edge of the movable portion 63. In this example, the diffraction grating portion 64 is formed in a substantially rectangular shape similar to the movable portion 63 in a plan view. In other words, the diffraction grating portion 64 is formed in a substantially rectangular shape in which the long side is parallel to the first direction D1 and a length L1 of the diffraction grating portion 64 in the first direction D1 exceeds a length L2 of the diffraction grating portion 64 in the second direction D2.

The coils 65 and 66 are made of a metal material such as copper and have a damascene structure embedded in the groove formed in the surface of the movable portion 63. In a plan view, the coil 65 is disposed on one side (upper side in FIG. 4) with respect to the axis A and the coil 66 is disposed on the other side (lower side in FIG. 4) with respect to the axis A.

Each of the coils 65 and 66 is spirally wound a plurality of times in a plan view. The outside end portion of the coil 65 is electrically connected via wiring 72 to an electrode pad 71 provided on the support portion 61. The wiring 72 extends over the support portion 61, one connecting portion 62, and the movable portion 63. The outside end portion of the coil 66 is electrically connected via wiring 74 to an electrode pad 73 provided on the support portion 61. The wiring 74 extends over the support portion 61, the other connecting portion 62, and the movable portion 63.

The inside end portion of the coil 65 is electrically connected to the inside end portion of the coil 66. In this example, the inside end portions of the coils 65 and 66 are electrically connected to each other by multilayer wiring 67. The multilayer wiring 67 can also be regarded as constituting a part of the coils 65 and 66, and it is also conceivable that the pair of coils 65 and 66 are configured by one coil wiring (multilayer wiring) extending so as to be folded back in an eight (8) shape in a plan view. The coils 65 and 66 may be formed integrally with each other.

The coil 65 has inside parts 65a extending along the axis A and outside parts 65b extending on the outer edge side of the movable portion 63. The inside parts 65a and the outside parts 65b extend in a straight line and in parallel to each other along the second direction D2. The inside parts 65a extend along the axis A at a certain interval from the axis A. The outside parts 65b extend along the outer edge of the movable portion 63 at a certain interval from the outer edge of the movable portion 63.

The coil 66 has inside parts 66a extending along the axis A and outside parts 66b extending on the outer edge side of the movable portion 63. The inside parts 66a and the outside parts 66b extend in a straight line and in parallel to each other along the second direction D2. The inside parts 66a extend along the axis A at a certain interval from the axis A. The outside parts 66b extend along the outer edge of the movable portion 63 at a certain interval from the outer edge of the movable portion 63.

The magnet 52 generates a magnetic field (magnetic force) acting on the coils 65 and 66. As illustrated in FIGS. 2, 7, 8A, and 8B, the magnet 52 is a neodymium magnet (permanent magnet) formed in a substantially rectangular parallelepiped shape and has a surface 54. The surface 54 is a surface on the side of the MEMS diffraction grating 51 and faces the MEMS diffraction grating 51 in the normal direction DN. The magnet 52 is made of a single member having different magnetic poles on one side and the other side in the normal direction DN. In other words, the magnet 52 is not a magnet configured by combining a plurality of members but an integrated bulk magnet magnetized in the thickness direction. In this example, the magnet 52 has an N pole part 57 on the side of the MEMS diffraction grating 51 and an S pole part 58 on the side opposite to the MEMS diffraction grating 51. In FIGS. 8A and 8B, the boundary line between the N pole part 57 and the S pole part 58 is indicated by a two-dot chain line.

The surface 54 includes a pair of inclined surfaces 55. Each of the inclined surfaces 55 is inclined such that the distance from the movable portion 63 of the MEMS diffraction grating 51 increases as the distance from the axis A increases when viewed in the second direction D2. The inclination angle of the inclined surface 55 (angle with respect to a plane perpendicular to the normal direction DN) is set to half of the maximum mechanical inclination angle of the movable portion 63 in the MEMS diffraction grating 51. As a result, it is possible to suppress the movable portion 63 interfering with the magnet 52 when the movable portion 63 swings around the axis A and the swing angle of the movable portion 63 can be increased. For example, when the maximum mechanical inclination angle is 10 degrees, the inclination angle of the inclined surface 55 is set to 5 degrees. As illustrated in FIG. 8B, when viewed in the second direction D2, straight lines that are virtual extensions of the pair of inclined surfaces 55 intersect at an intersection B on a straight line parallel to the normal direction DN through the axis A.

A recess portion 56 is formed in the surface 54. In this example, the recess portion 56 is a groove extending straight along the second direction D2. The recess portion 56 has, for example, a rectangular cross section uniform with respect to the second direction D2 and has a flat bottom surface 56a perpendicular to the normal direction DN. In the first direction D1, the recess portion 56 is disposed between the pair of inclined surfaces 55 and is connected to the pair of inclined surfaces 55. In the second direction D2, the recess portion 56 extends so as to reach both end portions of the magnet 52. The space in the recess portion 56 is a void. Alternatively, a non-magnetic body may be disposed in the space (the space may be filled with a non-magnetic body). The recess portion 56 is formed at the N pole part 57 so as to remain within the N pole part 57 and does not reach the S pole part 58. This is because an increase in the complexity of the line of magnetic force may arise and stable operation may be hindered if the recess portion 56 is formed so as to reach the S pole part 58 or the recess portion 56 is a through hole.

The positional relationship between the MEMS diffraction grating 51 and the magnet 52 that are viewed in the normal direction DN will be described with reference to FIG. 4. The length of the MEMS diffraction grating 51 in the first direction D1 exceeds the length of the magnet 52 in the first direction D1. The length of the magnet 52 in the first direction D1 is substantially equal to the length of the diffraction grating portion 64 in the first direction D1. The length of the MEMS diffraction grating 51 in the second direction D2 is substantially equal to the length of the magnet 52 in the second direction D2. The length of the magnet 52 in the second direction D2 exceeds the length of the diffraction grating portion 64 in the second direction D2. With such a positional relationship, it is possible to avoid the light from the QCL 4 being incident on the magnet 52 when the movable portion 63 swings around the axis A while making the magnet 52 as large as possible.

At least a part of the recess portion 56 (bottom surface 56a) overlaps the inside parts 65a and 66a of the coils 65 and 66 when viewed in the normal direction DN. In this example, a part of the recess portion 56 on the side of the axis A overlaps the entire inside parts 65a and 66a. In other words, when viewed in the normal direction DN, a width W1 of the recess portion 56 exceeds a width W2 of the inside parts 65a and 66a. The widths W1 and W2 are widths in the first direction D1. The recess portion 56 is positioned closer to the side of the axis A than the outside parts 65b and 66b of the coils 65 and 66 when viewed in the normal direction DN and does not overlap the outside parts 65b and 66b. As an example, the length of the magnet 52 in the first direction D1 is 4 mm and the length of the magnet 52 in the second direction D2 is 6 mm. The width W1 of the recess portion 56 is approximately 1 mm to 2 mm and is, for example, 2 mm. The depth of the recess portion 56 (distance between the bottom surface 56a and the intersection B) is approximately 1 mm, and the thickness of the magnet 52 in the normal direction DN is 3 mm to 3.5 mm.

The yoke 53 amplifies the magnetic force of the magnet 52 and forms a magnetic circuit together with the magnet 52. As illustrated in FIG. 2, the yoke 53 has an inclined surface 53a. The inclined surface 53a extends flat and perpendicularly to the normal direction DN and is inclined with respect to the first end surface 4a of the QCL 4. By fixing the MEMS diffraction grating 51 on the inclined surface 53a, a normal line N of the diffraction grating portion 64 of the MEMS diffraction grating 51 can be inclined with respect to the first end surface 4a. In this example, the diffraction grating portion 64 is inclined so as to face one side in the Z direction (side of the lid portion 22 of the housing 2). Alternatively, the diffraction grating portion 64 may be inclined so as to face the other side in the Z direction (bottom surface side of the housing 2). The inclination angle of the inclined surface 53a (angle with respect to the first end surface 4a) is set in accordance with the oscillation wavelength of the QCL 4, the number of grooves of the lattice grooves 64a in the diffraction grating portion 64, and the angle θ. For example, when the oscillation wavelength is approximately 7 μm and the number of grooves is 150 per millimeter, the inclination angle of the inclined surface 53a is set to approximately 30 degrees.

The yoke 53 is formed in a substantially U shape (inverted C shape) when viewed in the X direction and defines a disposition space SP open to the inclined surface 53a. The magnet 52 is disposed in the disposition space SP, and the magnet 52 is accommodated in the yoke 53. The yoke 53 surrounds the magnet 52 when viewed in the X direction. The MEMS diffraction grating 51 is fixed to the inclined surface 53a in the edge portion of the support portion 61 so as to cover the opening of the disposition space SP. The MEMS diffraction grating 51 is disposed such that the first direction D1 is along (parallel to) the Z direction (lamination direction of the laminated structure 42 of the QCL 4) and the second direction D2 (axis A) is parallel to the X direction when viewed in the Y direction.

The QCL 4 emits light having a beam shape that is long in the lamination direction of the laminated structure 42. In the laser module 1, the light emitted from the QCL 4 and incident on the MEMS diffraction grating 51 via the lens 6 has an elliptical beam shape in which the length in the first direction D1 exceeds the length in the second direction D2 at the position of the diffraction grating portion 64. In addition, the MEMS diffraction grating 51 is disposed such that all of the light emitted from the QCL 4 and transmitted through the lens 6 is incident on the diffraction grating portion 64 regardless of the swing angle of the movable portion 63 around the axis A. In other words, the entire light is incident on the diffraction grating portion 64 even in a state where the movable portion 63 swings around the axis A up to the maximum mechanical inclination angle.

Figure 3:
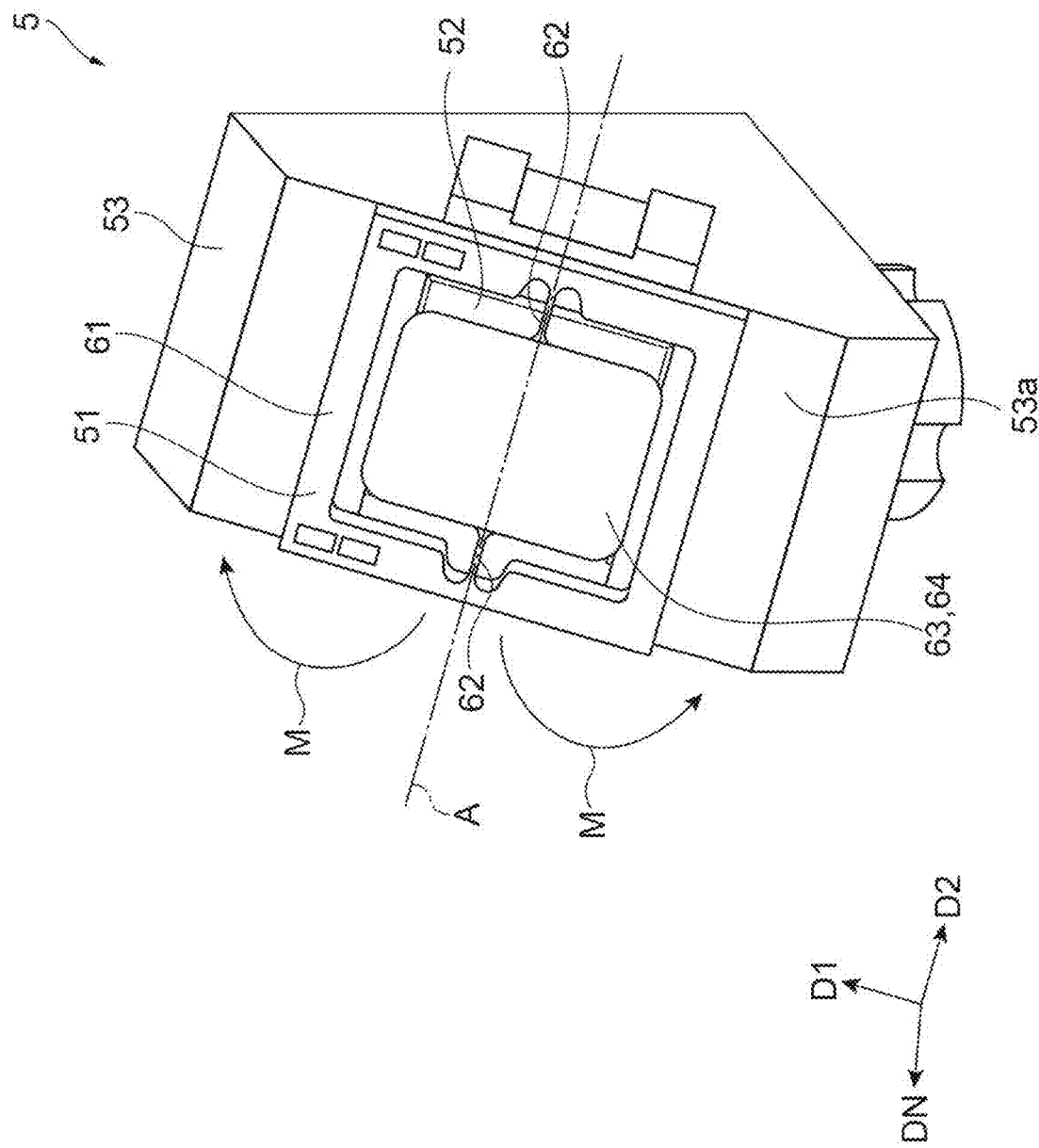
FIG. 3 is a perspective view of a diffraction grating unit.

As illustrated in FIG. 3, the magnet 52 and the yoke 53 form a magnetic field M passing through the MEMS diffraction grating 51. In this example, the magnetic field M is formed so as to cross the movable portion 63 from the side of the axis A toward the edge portion side of the movable portion 63. The yoke 53 is formed of a carbon-added iron material. As a result, a processing process for the inclined surface 53a can be facilitated. The surface of the yoke 53 may be protected by galvanization or the like for deterioration prevention.

When currents flow through the coils 65 and 66 in the MEMS diffraction grating 51, the magnetic field M formed by the magnet 52 and the yoke 53 causes the Lorentz force in a predetermined direction in the electrons flowing in the coils 65 and 66. As a result, the coil 65 receives a force in a predetermined direction. Accordingly, the movable portion 63 (diffraction grating portion 64) can be swung around the axis A by controlling, for example, the direction or magnitude of the current flowing through the coil 65. In addition, the movable portion 63 can be swung at a high speed at a resonance frequency level (for example, at a frequency of 1 kHz or more) by passing currents having a frequency corresponding to the resonance frequency of the movable portion 63 through the coils 65 and 66. In the manner, the coils 65 and 66, the magnet 52, and the yoke 53 function as actuator portions swinging the movable portion 63.

Figure 4:
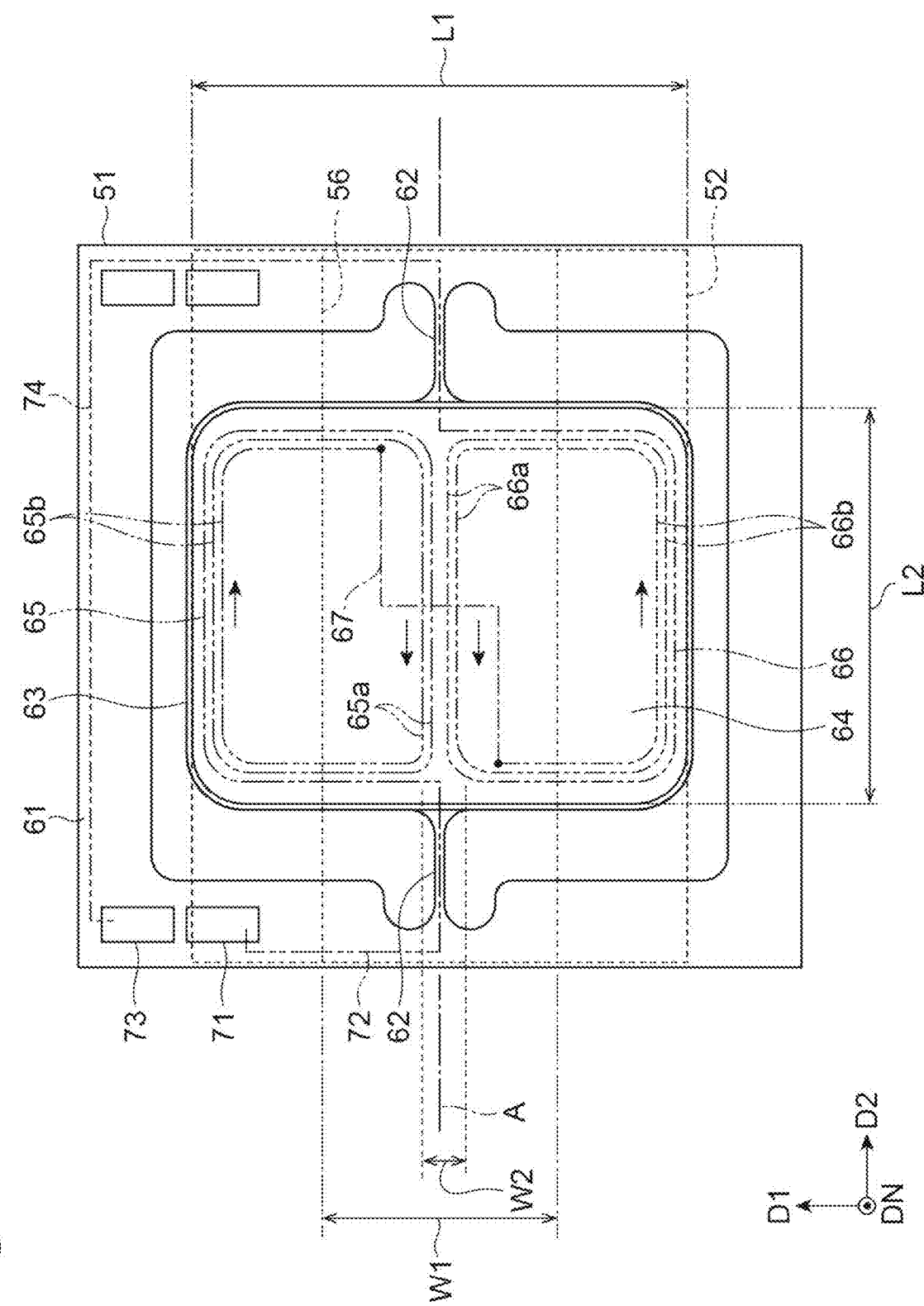
FIG. 4 is a view of a MEMS diffraction grating viewed in a normal direction.

In FIG. 4, the directions of the currents flowing through the coils 65 and 66 are indicated by arrows. As illustrated in FIG. 4, in the MEMS diffraction grating 51, currents flow through the outside parts 65b and 66b of the coils 65 and 66 in the same direction. As a result, a large driving force for swinging the movable portion 63 can be ensured.

Function and Effect

In the laser module 1, the magnet 52 is disposed on the side opposite to the QCL 4 with respect to the MEMS diffraction grating 51. As a result, the size of the module can be reduced as compared with a case where, for example, the magnet 52 is disposed on the lateral side of the MEMS diffraction grating 51. In addition, the MEMS diffraction grating 51 is provided with the pair of coils 65 and 66, which are respectively disposed on one side and the other side with respect to the axis A when viewed in the normal direction DN. As a result, currents are capable of flowing through the outside parts 65b and 66b of the coils 65 and 66 in the same direction and a large driving force (furthermore, deflection angle) can be ensured. In addition, the number of turns of the coils 65 and 66 can be increased at the parts of the diffraction grating portion 64 far from the axis A (outside parts 65b and 66b), which also makes it possible to ensure a large driving force. Meanwhile, the direction of current flow through the inside parts 65a and 66a is opposite to the direction of current flow through the outside parts 65b and 66b, and thus a vibration mode other than vibration around the axis A (for example, a resonance mode in the front-rear direction or the lateral direction) may occur in the movable portion 63 and the operation of the MEMS diffraction grating 51 may become unstable. In this regard, in the laser module 1, the recess portion 56 is formed in the surface 54 of the magnet 52 on the side of the MEMS diffraction grating 51 and at least a part of the recess portion 56 overlaps the inside parts 65a and 66a of the coils 65 and 66 when viewed in the normal direction DN. As a result, the magnetic force acting on the inside parts 65a and 66a can be reduced and the operation can be stabilized. In particular, the operation is likely to become unstable when the number of turns of the coils 65 and 66 is increased for an increase in driving force, but in the laser module 1, the operation can be stabilized even when the driving force is increased by an increase in the number of turns. In addition, the recess portion 56 is formed at the part of the magnet 52 overlapping the inside parts 65a and 66a, and thus the total volume of the magnet 52 can be ensured, a magnetic force acting on the outside parts 65b and 66b can be ensured, and a large driving force can be ensured. Accordingly, with the laser module 1, size reduction can be achieved and it is possible to stably operate the MEMS diffraction grating 51 while ensuring a large deflection angle. Although it is conceivable to form a through hole instead of the recess portion in the magnet 52 in order to reduce the magnetic force acting on the inside parts 65a and 66a, the magnetic field M may be disturbed as a result of the through hole formation. In contrast, in the laser module 1, the recess portion 56 having the bottom surface 56a is formed in the magnet 52, and thus the magnetic field M can be formed satisfactorily.

The recess portion 56 is a groove extending along the X direction parallel to the axis A. As a result, it is possible to ensure a magnetic force acting on the outside parts 65b and 66b of the coils 65 and 66 while reducing the magnetic force acting on the inside parts 65a and 66a of the coils 65 and 66.

The surface 54 of the magnet 52 includes the pair of inclined surfaces 55 inclined such that the distance from the movable portion 63 increases as the distance from the axis A increases when viewed in the X direction. As a result, it is possible to dispose the magnet 52 closer to the MEMS diffraction grating 51 while suppressing contact of the swinging movable portion 63 with the magnet 52 and a large magnetic force acting on the coils 65 and 66 can be ensured.

The magnet 52 is made of a single member having different magnetic poles on one side and the other side in the normal direction DN. As a result, only one magnetic pole (N pole in the above example) faces the MEMS diffraction grating 51, a magnetic circuit can be formed such that a line of magnetic force penetrates the MEMS diffraction grating 51 along the normal direction DN, and a suitable rotational torque for swinging the movable portion 63 around the axis A can be generated.

When viewed in the normal direction DN, the width W1 of the recess portion 56 exceeds the width W2 of the inside parts 65a and 66a of the coils 65 and 66. As a result, it is possible to ensure a magnetic force acting on the outside parts 65b and 66b while reducing the magnetic force acting on the inside parts 65a and 66a.

The recess portion 56 does not overlap the outside parts 65b and 66b of the coils 65 and 66 when viewed in the normal direction DN. As a result, it is possible to ensure a magnetic force acting on the outside parts 65b and 66b while reducing the magnetic force acting on the inside parts 65a and 66a.

MODIFICATION EXAMPLES

Figure 9A:
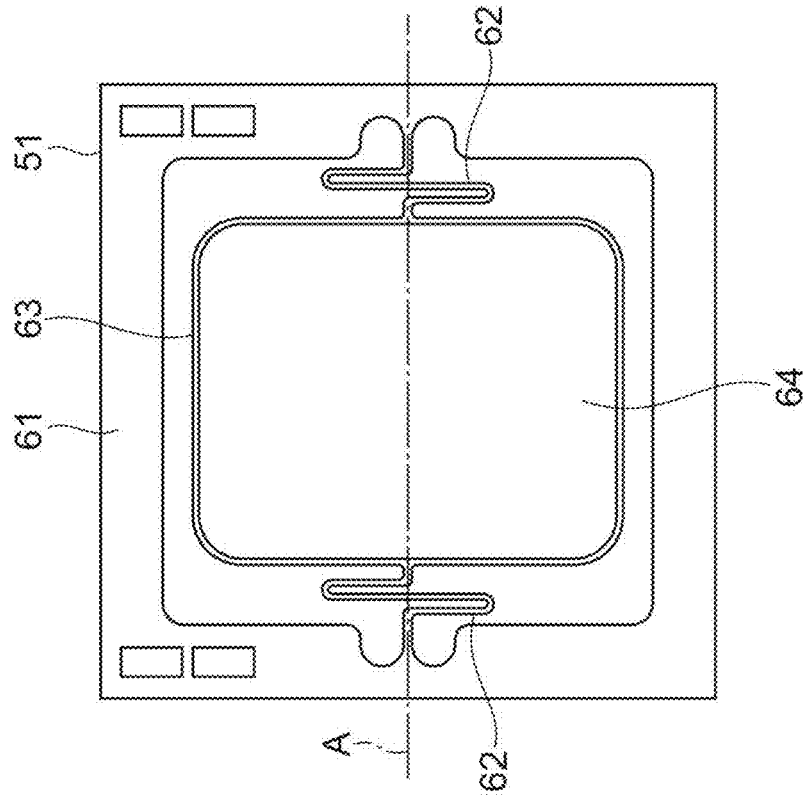
FIGS. 9A and 9B are plan views of MEMS diffraction gratings of first and second modification examples.
Figure 9B:
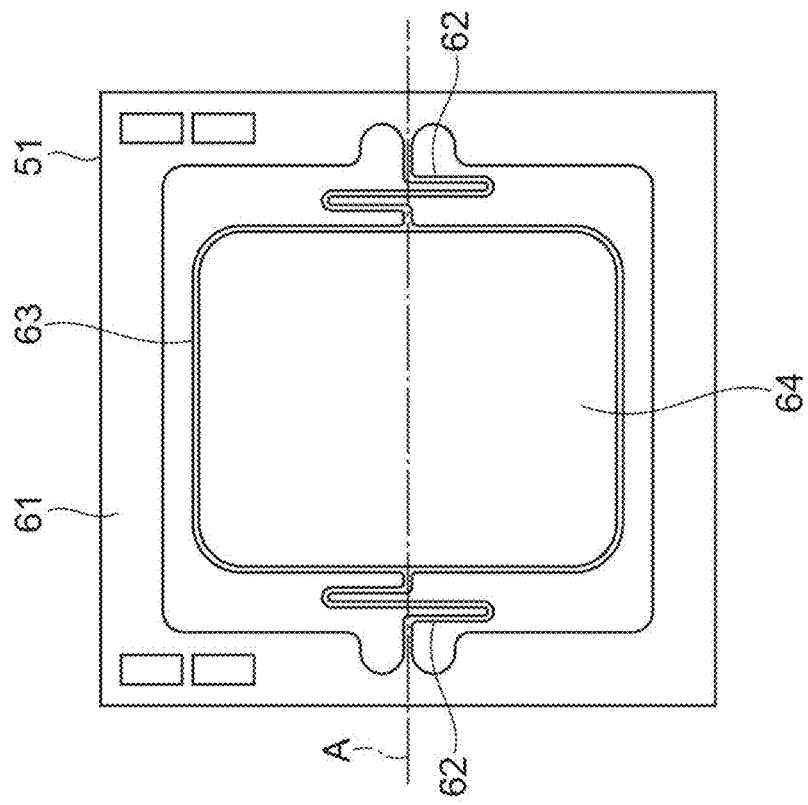
Figure 10:
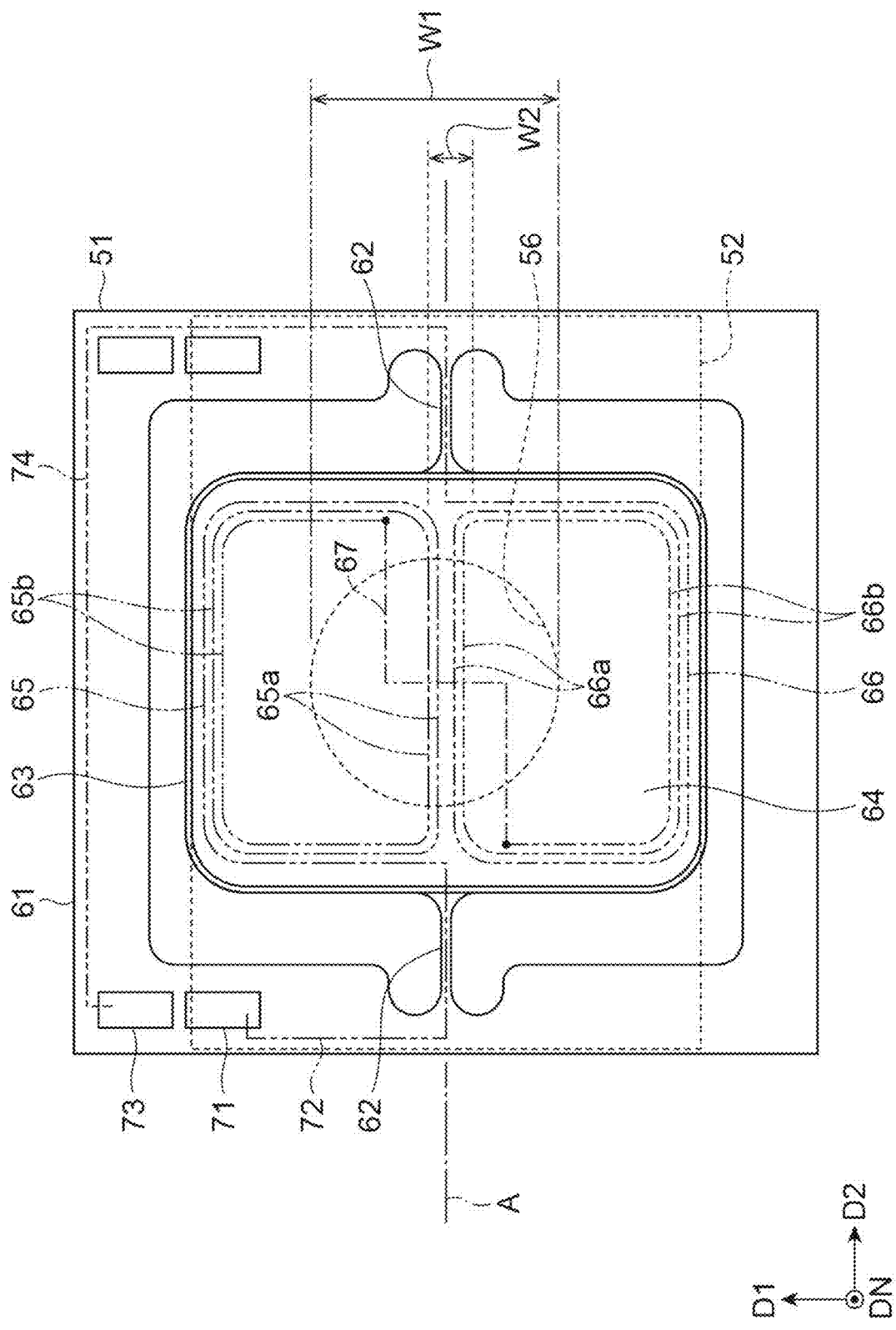
FIG. 10 is a view of a diffraction grating unit of a third modification example viewed in the normal direction.
Figure 11:
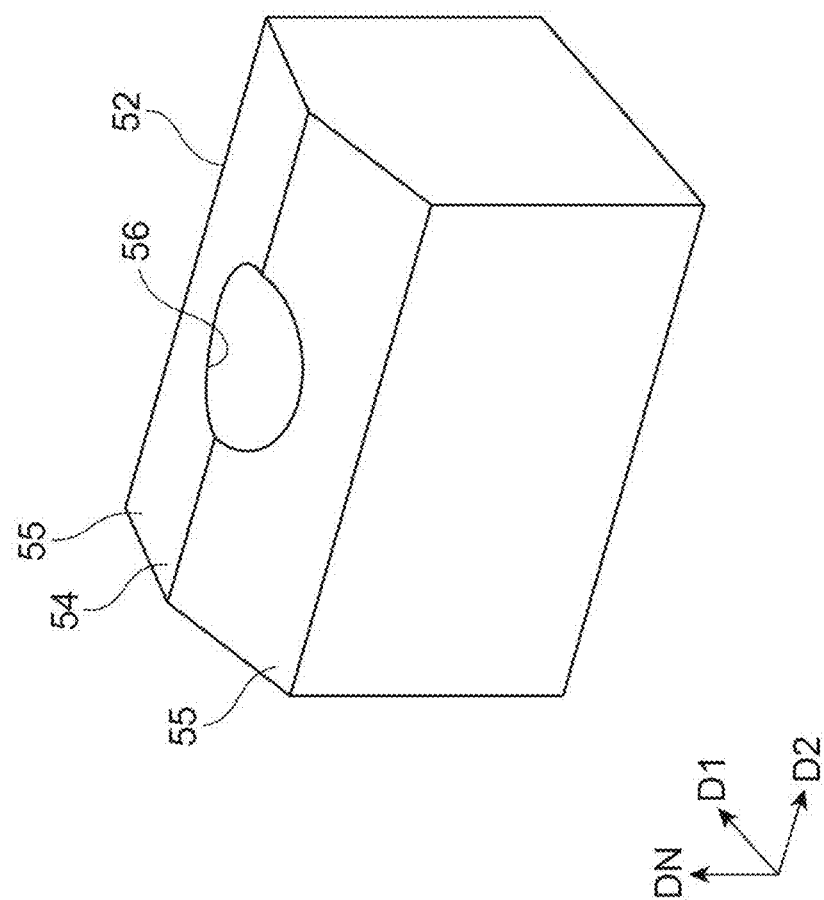
FIG. 11 is a perspective view of a magnet of the third modification example.
Figure 12B:
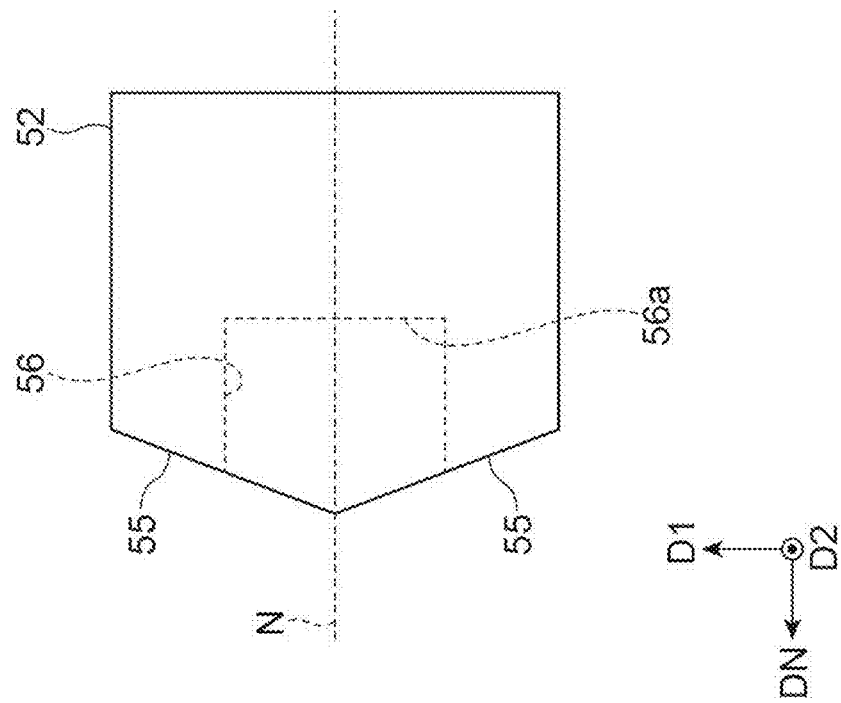
FIG. 12B is a side view of the magnet of the third modification example.
Figure 12A:
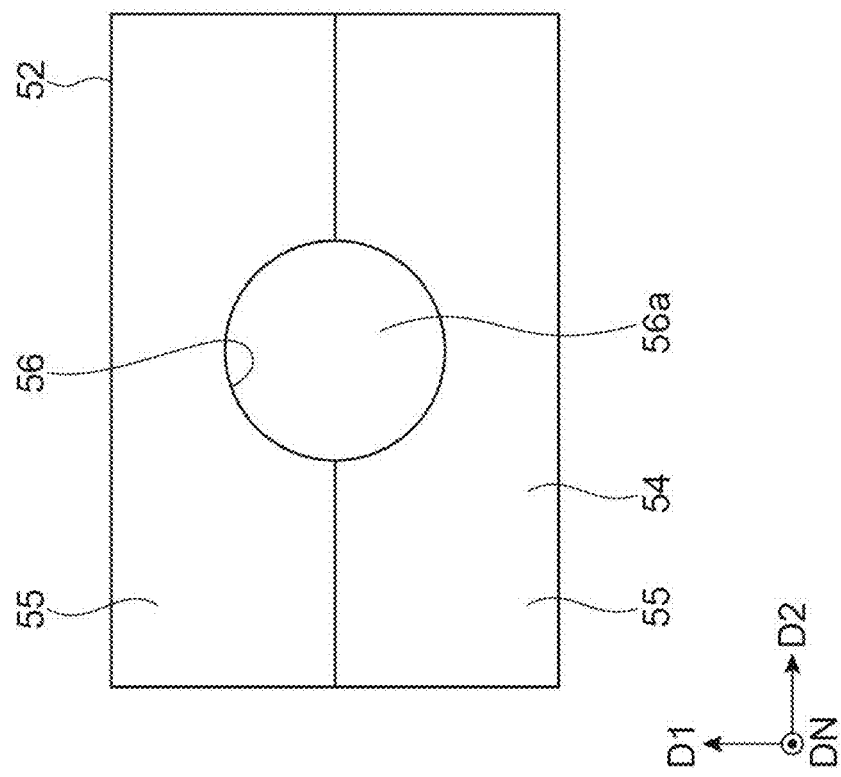
FIG. 12A is a plan view of the magnet of the third modification example.

The MEMS diffraction grating 51 may be configured as in a first modification example illustrated in FIG. 9A or a second modification example illustrated in FIG. 9B. Each connecting portion 62 extends in a meandering matter in the first and second modification examples. In the first modification example, the pair of connecting portions 62 are symmetrically formed in relation to a straight line passing through the center of the movable portion 63 and perpendicular to the axis A in a plan view. In the second modification example, the pair of connecting portions 62 are asymmetrically formed in relation to the straight line in a plan view. The first and second modification examples as well as the above embodiment enable size reduction and make it possible to stably operate the MEMS diffraction grating 51 while ensuring a large deflection angle. In addition, the first and second modification examples can be suitably used when the movable portion 63 is operated in a non-resonant mode. When the movable portion 63 is operated in a non-resonant mode, the wavelength of the output light L can be controlled and can be fixed to any wavelength.

The magnet 52 may be configured as in a third modification example illustrated in FIGS. 10 to 12B. In the third modification example, the recess portion 56 is configured by a hole instead of a groove. The recess portion 56 is, for example, a substantially columnar hole having a circular cross section uniform with respect to the normal direction DN and has the bottom surface 56a that is flat and perpendicular to the normal direction DN. The diameter of the recess portion 56 is approximately 1 mm to 2 mm and is, for example, 2 mm. At least a part of the recess portion 56 (bottom surface 56a) overlaps the inside parts 65a and 66a of the coils 65 and 66 when viewed in the normal direction DN. In this example, a part of the recess portion 56 on the side of the axis A overlaps a part of the inside parts 65a and 66a. The width W1 of the recess portion 56 exceeds the width W2 of the inside parts 65a and 66a. The recess portion 56 does not overlap the outside parts 65b and 66b of the coils 65 and 66 when viewed in the normal direction DN. The third modification example as well as the above embodiment enables size reduction and makes it possible to stably operate the MEMS diffraction grating 51 while ensuring a large deflection angle. The recess portion 56 may have any non-columnar shape. For example, the recess portion 56 may be a substantially prismatic hole having a rectangular cross section.

The present disclosure is not limited to the above embodiment and modification examples. For example, various materials and shapes not limited to those described above can be adopted as the material and shape of each configuration. In the above embodiment, the pair of coils 65 and 66 are configured by one coil wiring connected in series. Alternatively, the coils 65 and 66 may be configured separately and pulled out separately to the outside. From the viewpoint of current increase and controllability improvement, it is preferable that the coils 65 and 66 are configured by one coil wiring.

At least a part of the recess portion 56 may overlap the inside parts 65a and 66a of the coils 65 and 66 when viewed in the normal direction DN, and the entire recess portion 56 may overlap the inside parts 65a and 66a. The width W1 of the recess portion 56 may be equal to or less than the width W2 of the inside parts 65a and 66a. The shape of the movable portion 63 is not limited to a rectangular shape. For example, the shape may be an elliptical shape, a circular shape, or a square shape. The shape of the diffraction grating portion 64 is not limited to a rectangular shape. For example, the shape may be an elliptical shape, a circular shape, or a square shape.

The MEMS diffraction grating 51 can be regarded as a MEMS actuator driving an optical surface (diffraction grating portion 64), and the diffraction grating unit 5 can be regarded as an actuator device. In other words, an actuator device includes a MEMS actuator having the movable portion 63 capable of swinging around the predetermined axis A and an optical surface formed on the movable portion 63, the magnet 52 disposed on the side opposite to the MEMS actuator with respect to the movable portion 63, and the yoke 53 forming a magnetic circuit together with the magnet 52. The MEMS actuator further has a coil on which the magnetic force of the magnet 52 acts, the coils 65 and 66 include the pair of coils 65 and 66 respectively disposed on one side and the other side with respect to the axis A when viewed in the normal direction DN parallel to the normal line of the optical surface, and the coils 65 and 66 respectively have the inside parts 65a and 66a extending along the axis A. The recess portion 56 is formed in the surface of the magnet 52 on the side of the MEMS actuator, and at least a part of the recess portion 56 overlaps the inside parts 65a and 66a of the coils 65 and 66 when viewed in the normal direction DN. Such an actuator device as well as the above embodiment enables size reduction and makes it possible to stably operate the MEMS actuator while ensuring a large deflection angle. The optical surface is not limited to a diffraction grating surface and may be a mirror surface.

What is claimed is:

1. An external resonance-type laser module comprising:
   a quantum cascade laser;

a MEMS diffraction grating including a movable portion capable of swinging around a predetermined axis and a diffraction grating portion formed on the movable portion, wherein the MEMS diffraction grating diffracts and reflects light emitted from the quantum cascade laser by the diffraction grating portion, and returns a part of the light to the quantum cascade laser;

a lens disposed between the quantum cascade laser and the MEMS diffraction grating;

a magnet disposed on a side opposite to the quantum cascade laser with respect to the MEMS diffraction grating; and a yoke forming a magnetic circuit together with the magnet, wherein the movable portion is formed in a plate shape, the MEMS diffraction grating includes a support portion and a connecting portion connecting the movable portion to the support portion on the axis such that the movable portion is capable of swinging around the axis, the movable portion is capable of vibrating as a single degree-of-freedom vibration system, the MEMS diffraction grating further includes a coil formed in the movable portion and on which a magnetic force of the magnet acts, the coil includes a pair of coils respectively disposed on one side and the other side with respect to the axis when viewed in a normal direction parallel to a normal line of the diffraction grating portion, and each of the pair of coils includes an inside part extending along the axis, and a recess portion is formed in a surface of the magnet on a side of the MEMS diffraction grating and at least a part of the recess portion overlaps the inside part of each of the pair of coils when viewed in the normal direction.

2. The external resonance-type laser module according to claim 1, wherein the recess portion is a groove extending along a direction parallel to the axis.

3. The external resonance-type laser module according to claim 1, wherein the recess portion is a hole having a bottom surface.

4. The external resonance-type laser module according to claim 1, wherein the surface of the magnet includes a pair of inclined surfaces inclined such that a distance from the movable portion increases as a distance from the axis increases when viewed in a direction parallel to the axis.

5. The external resonance-type laser module according to claim 1, wherein the magnet consists of a single member having different magnetic poles on one side and the other side in the normal direction.

6. The external resonance-type laser module according to claim 1, wherein a width of the recess portion exceeds a width of the inside part of the pair of coils when viewed in the normal direction.

7. The external resonance-type laser module according to claim 1, wherein each of the pair of coils includes an outside part extending in parallel to the inside part along an outer edge of the movable portion, and the recess portion does not overlap the outside part of each of the pair of coils when viewed in the normal direction.

8. An external resonance-type laser module comprising:

a quantum cascade laser;

a MEMS diffraction grating including a movable portion capable of swinging around a predetermined axis and a diffraction grating portion formed on the movable portion, wherein the MEMS diffraction grating diffracts and reflects light emitted from the quantum cascade laser by the diffraction grating portion, and returns a part of the light to the quantum cascade laser;

a lens disposed between the quantum cascade laser and the MEMS diffraction grating;

a magnet disposed on a side opposite to the quantum cascade laser with respect to the MEMS diffraction grating; and a yoke forming a magnetic circuit together with the magnet, wherein the MEMS diffraction grating further includes a coil on which a magnetic force of the magnet acts, the coil includes a pair of coils respectively disposed on one side and the other side with respect to the axis when viewed in a normal direction parallel to a normal line of the diffraction grating portion, and each of the pair of coils includes an inside part extending along the axis, a recess portion is formed in a surface of the magnet on a side of the MEMS diffraction grating and at least a part of the recess portion overlaps the inside part of each of the pair of coils when viewed in the normal direction, and the surface of the magnet includes a pair of inclined surfaces inclined such that a distance from the movable portion increases as a distance from the axis increases when viewed in a direction parallel to the axis.

* * * * *